(12) United States Patent
Butterbaugh et al.

(10) Patent No.: US 6,283,512 B1
(45) Date of Patent: Sep. 4, 2001

(54) ENHANCED PANEL LATCH

(75) Inventors: Matthew Allen Butterbaugh; James Larry Peacock, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/371,128

(22) Filed: Aug. 10, 1999

(51) Int. Cl.[7] .................................................. E05C 19/06
(52) U.S. Cl. ................................ 292/87; 411/508; 24/453
(58) Field of Search ........................... 411/508–510, 913; 312/223.2, 223.1, 265.6; 174/50.51; 361/725, 726, 759, 801; 292/19, 20, 87; 24/297, 293, 453

(56) References Cited

U.S. PATENT DOCUMENTS

| | | | |
|---|---|---|---|
| 2,891,755 | * | 6/1959 | Clark .................................. 248/220.5 |
| 3,059,299 | * | 10/1962 | Sarafinas ................................. 24/73 |
| 3,864,789 | * | 2/1975 | Leitner ................................... 24/73 |
| 5,036,567 | * | 8/1991 | Clinch .................................. 411/508 |
| 5,241,727 | * | 9/1993 | Lee ....................................... 24/453 |
| 5,873,690 | * | 2/1999 | Danby .................................. 411/508 |
| 5,879,101 | * | 3/1999 | Hagura ................................. 403/326 |
| 6,074,150 | * | 6/2000 | Shinozaki ............................. 411/913 |

FOREIGN PATENT DOCUMENTS

0149312  *  2/1982 (JP) ...................................... 411/508

* cited by examiner

Primary Examiner—Gary Estremsky
(74) Attorney, Agent, or Firm—Robert H. Berdo, Jr.

(57) ABSTRACT

A panel latch 10 includes at least one flexible latch member 24, 26 having a base portion 36, a first leg 32, and a second leg 34 attached to the first leg via the base portion. The flexible latch member 24, 26 further has a latch portion 46 and a stop member 82 disposed on the first leg 32. The latch portion 46 is separated from the stop member 82 to accommodate therebetween at least two separate parts 12, 14 that are to be latched together. The legs 32, 34 of the flexible latch member can be flexed so as to shift the latch portion 46 and the stop member 82 in a direction toward the second leg 34 to allow the two parts 12, 14 to be unlatched from each other. A generally U-shaped, rigid latch retaining member 28 is provided that has a first leg 54 with free end. A second leg 56 of the latch retaining member 28 is connected to the flexible latch member 24, 26. The first leg 54 of the latch retaining member has a catch portion 68 and a stop member 74 disposed thereon in a region of the free end to accommodate and hold therebetween only one 12 of the at least two separate parts that are to be latched together.

25 Claims, 3 Drawing Sheets

ENHANCED PANEL LATCH

BACKGROUND OF THE INVENTION

1. Field of the Invention

The present invention relates to an enhanced panel latch, and in particular, to a one-piece panel latch that is configured to minimize electromagnetic radiation emissions through a latch-receiving opening formed in a panel, for example.

2. Background Information

Frames or other enclosures are often used to house, for example, the various components of an electrical device, such as a computer. For example, circuit boards of the computer may be located within a metal frame to protect the circuit boards from being damaged, and to provide support for the circuit boards so that the circuit boards are properly positioned relative to each other.

In order to conceal the various inner workings of the computer, the frame may be provided with a cover, which may include one or more panels, formed from metal, for example. The installed panel provides a barrier between the internal electrical components of the computer and the user. The panel prevents the user from inadvertently coming in contact with a high-temperature or high-powered component located within the frame, thus protecting the user from accidental injury.

Further, panels help protect the components located within the frame from environmental damage, such as dust or liquid contamination. For example, should a user inadvertently spill a glass of water on the computer, the panel will provide a barrier that will help prevent the water from coming in contact with the internal components.

Additionally, panels provide sound barriers that help to muffle any noise generated by the components within the computer. For example, cooling blowers or fans are often used within the computer frame to cool the high-powered components located within the computer. These cooling blowers tend to generate a substantial amount of noise, which may be annoying to the user of the computer or to others working in the vicinity of the computer. The panel helps to contain this noise.

Furthermore, panels can serve as an electromagnetic shield. As is known, the electrical components located within the frame, when operated, generate emissions that include electromagnetic radiation. When this electromagnetic radiation influences the proper functioning of another device, the result is known as electromagnetic interference (also known as EMI).

In order to ensure that electromagnetic radiation is emitted only at acceptable levels, i.e., to prevent electromagnetic interference, various standards have been developed. For example, both the United States and Canada have determined acceptable electromagnetic radiation emission limits for electrical devices operating at set frequencies. If the electrical device exceeds the determined acceptable emission limits, the sale or use of the electrical device may be prohibited.

In order to reduce the emitted electromagnetic radiation, the panel can be configured to enclose the frame, and be formed of a metal, that, when grounded, will attenuate the electromagnetic radiation.

The panel is typically fastened directly to the underlying frame. For example, the panel may be permanently affixed to the frame by welding or gluing the panel to the frame. However, it may be desirable in certain situations to be able to remove the panel from the frame, for example, to allow for the easy replacement of components located within the frame. Thus, it is known to fasten the panel to the underlying frame using removable fasteners. This provides a secure connection between the panel and the frame and helps to prevent the panel from rattling against the frame. For example, a two-piece plastic fastener may be used, which includes a grommet snapped into an opening formed in a receiving part (such as an edge of the frame), and a movable plunger snapped into an opening formed in the removable panel. By engaging the plunger with the grommet, the removable panel can be secured to the receiving part. However, this arrangement requires two discrete components, thus increasing the risk that one of the components may become lost. Additionally, this arrangement requires a relatively precise alignment between the plunger and the grommet for their engagement. Moreover, this known fastener may not draw the removable panel up tight to the receiving part, thus allowing the removable panel to vibrate freely relative to the receiving part. Thus, there is a need for a one-piece panel latch that will hold a removable panel tightly in place, thus preventing a free vibration of the removable panel relative to the receiving part.

Alternatively, threaded fasteners, such as so-called thumbscrews, may be used to fix the removable panel to the frame. Threaded fasteners may provide for a more secure connection than the aforementioned two-piece plastic fastener. However, threaded fasteners require a threaded hole in the receiving part, which increases the cost of producing the receiving part. Moreover, installing and removing threaded fasteners requires numerous turns of the threaded fastener to fully draw the removable panel against the receiving part. Thus, installing and removing a threaded fastener is labor-intensive. Further, a threaded fastener may require the use of a special tool to fully secure the removable panel to the receiving part. Additionally, the threaded fastener is prone to cross-threading, causing damage to both the threaded fastener and the receiving part, thus leaving the threaded fastener, panel and receiving part, unusable. Thus, there is a need for a panel latch that does not require a threaded receiving hole, needs no tools to install, and which can be installed both quickly and easily.

The number of fasteners needed generally depends on the size of the panel, and the size of the fasteners. As will be appreciated, a large fastener may be capable of exerting a greater holding force than a small fastener. Thus, for ease of assembly, it may be desirable to utilize one large fastener, for example, rather than several small fasteners. However, with respect to the aforementioned two-piece plastic fastener, increasing the size of the grommet and movable plunger may require a similar increase in size in an opening formed in the removable panel, in order to accommodate the larger plunger. If the removable panel is used as an electromagnetic radiation shield, increasing the size of the opening in the removable panel disadvantageously allows for the passage of emitted electromagnetic radiation (in the form of electromagnetic radiation waves), thus raising the possibility of electrical magnetic interference.

It is known that an opening will attenuate electromagnetic radiation waves when the opening is less than ½ of the wavelength $\lambda$ to be attenuated (i.e., length of opening<½$\lambda$). Moreover, the smaller the opening, the greater the attenuation of the electromagnetic radiation waves. The attenuation of electromagnetic radiation waves due to passage through an opening can be determined using the following formula:

$$S=20\log(\lambda/2L),$$

where

S=the shielding effectiveness of the opening (in decibels);

λ=the wavelength of the electromagnetic radiation; and

L=the maximum linear length of the opening (in meters).

Moreover, the wavelength λ can be determined by dividing the velocity of the electromagnetic radiation wave (i.e., the wave speed, which is approximately $3\times10^8$ m/sec) by the frequency of the electromagnetic radiation emissions.

Thus, as the operational frequency (and hence, speed) of an electrical device increases, the associated wavelengths become smaller, thus requiring smaller openings. Therefore, it is clear that the size of any opening in the removable panel must be considered, so as to not unnecessarily limit the speed (i.e., bandwidth) of the electrical components located in the frame.

Thus, there is a need for a panel latch that can securely hold a removable panel against a frame, and which does not require a large opening formed in the removable panel to accommodate the panel latch.

SUMMARY OF THE INVENTION

It is, therefore, a principle object of this invention to provide an enhanced panel latch.

It is another object of the invention to provide an enhanced panel latch that solves the above-mentioned problems.

These and other objects of the present invention are accomplished by the enhanced panel latch disclosed herein.

According to one aspect of the invention, the panel latch includes a first latch handle, and a second latch handle arranged under the first handle. In a latched positioned, the first latch handle and the second latch handle are spaced apart from each other. Further, the first latch handle and the second latch handle are positioned relative to each other so that the first latch handle and the second latch handle can be simultaneously gripped by a user, and positioned in contact with each other in response to opposing forces acting on the respective handles. Moreover, the latch handles may have a rectangular configuration, with each handle having a major surface suitable for gripping. Further, the major surfaces may be provided with a textured surface, to allow the user to securely grip the respective handles. Thus, the latch handles advantageously allow for an easy grasping of the panel latch, thereby facilitating the insertion and release of the panel latch.

In a further exemplary embodiment of the present invention, the first and second latch handles are joined together using a plurality of spaced apart and aligned U-shaped members, for example, three U-shaped members. Two of the U-shaped members are connected to both the first and second latch handles, and the third U-shaped member is connected to only one of the latch handles, for example, the second latch handle. The U-shaped members are used to hold the removable panel to the system frame, and/or to hold the panel latch to the removable panel. By providing a plurality of spaced apart U-shaped members to perform these tasks, rather than one single larger latch member, for example, the size of a latch-accommodating opening in the removable panel can advantageously be reduced. For example, in the case where there are three U-shaped members, instead of one large opening for receiving the panel latch, the removable panel can be provided with three, relatively small, separate openings, each for accommodating a respective U-shaped member. By reducing the size of the openings in the removable panel, electromagnetic radiation emissions through the latch-accommodating openings are advantageously reduced to a level that is lower than if one larger opening were provided, without significantly reducing the latching strength of the panel latch.

According to a further exemplary aspect of the invention, the U-shaped members are integrally formed with the latch handles, and extend in a permanent relationship from an edge of a respective rectangular-shaped latch handle. This arrangement results in a one-piece configuration that advantageously reduces the number of components that need to be manufactured, and eliminates the risk of losing a component of the panel latch. Moreover, since the panel latch is self-contained, alignment of various latch components is unnecessary.

In a further exemplary aspect of the invention, two of the U-shaped members are substantially identically configured as flexible latch members, which are used to latch the removable panel to the underlying frame, for example. The flexible latch members are arranged essentially parallel to each other, and separated from each other by a space.

The U-shape of each flexible latch member is defined by first and second spaced-apart legs that are joined together at a base, which forms a bottom of the U-shape. Each leg has an end opposite to the base, that is permanently affixed to a respective latch handle.

Each flexible latch member has a latch portion positioned on the first leg, and in a region toward the base of the latch member. The latch portion has a surface that slopes upward and away from the base of the latch member, similar to a ramp, and a flat abutting surface that extends approximately perpendicular to the surface of the first leg. The flat abutting surface and the sloping surface are contiguous to each other, so as to form a step. When the panel latch is installed and in the latched position, the flat abutting surface will about against an inner surface of the system frame. This arrangement will advantageously allow a removable panel to be automatically latched to a receiving part, such as an edge of a frame, using no tools. Moreover, since the latch portion is disposed in a region toward the base of the flexible latch member, when the panel latch is engaged with a frame, only a minimal portion of the panel latch will protrude into the interior space of the frame. Thus, the panel latch advantageously does not occupy any substantial amount of space in the frame, allowing the interior of the frame to be utilized in a most effective manner.

In a further exemplary aspect of the invention, the panel latch has a third U-shaped member configured as a relatively rigid latch retaining member, which is used to permanently engage the panel latch to the removable panel, for example.

The latch retaining member is arranged parallel to, and disposed between, the flexible latch members. Further, the latch retaining member is separated from each of the adjacent flexible latch members by a space.

The latch retaining member has a configuration similar to the flexible latch members. For example, the U-shape of the latch retaining member is defined by first and second spaced-apart legs that are joined together at a base, which forms a bottom of the U-shape. However, and in contrast to the configuration of the flexible latch members, only the second leg of the latch retaining member is permanently affixed to a latch handle, for example, the second latch handle. The first leg of the latch retaining member has a free end positioned adjacent to, but separated from, the edge of the first latch handle.

The latch retaining member has a catch portion positioned on the surface of the first leg. The catch portion is positioned more proximate to the first latch handle than the respective latch portions disposed on the flexible latch members.

The catch portion has a surface that slopes upward and away from the base of the latch retaining member, and a flat abutting surface that extends approximately perpendicular to the surface of the first leg. The flat abutting surface and the sloping surface are contiguous to each other, so as to form a step.

The latch retaining member further has a stop member positioned on the surface of the first leg, and at the free end thereof. The stop member projects upward and away from the surface, and has a flat abutting surface that extends approximately perpendicular to the surface. The flat abutting surface of the stop member faces the flat abutting surface of the catch portion. Moreover, the flat abutting surface of the stop member is separated from the flat abutting surface of the catch portion by a first predetermined distance, for example, a distance corresponding to a thickness of the removable panel. Thus, when the panel latch is installed in the removable panel, the flat abutting surface of the stop member will abut against an outer surface of the removable panel, and the flat abutting surface of the catch portion will abut against an inner surface of the removable panel, thus retaining the panel latch on the removable panel. This configuration will advantageously allow the panel latch to be semi-permanently fastened to the removable panel, thus minimizing the chance of loss or damage to the panel latch.

In a further exemplary aspect of the invention, the flexible latch members are likewise provided with stop members positioned on the surface of the respective first legs, and in alignment with the stop member disposed at the free end of the latch retaining member. Each stop member projects upward and away from the respective surface, and has a flat abutting surface that extends approximately perpendicular to the respective surface. The flat abutting surfaces of the respective stop members face the flat abutting surfaces of the respective latch portions. Moreover, each flat abutting surface of the respective stop members is separated from the corresponding flat abutting surface of the respective latch portions by a second predetermined distance, which is greater than the first predetermined distance.

When the panel latch is installed and in the latched position, the flat abutting surface of the stop members will abut against an outer surface of the removable panel, and the flat abutting surfaces of the latch portions of the flexible latch members will abut against an inner surface of the frame. As such, both the removable panel and the system frame will advantageously be held together. Moreover, the second predetermined distance between the flat abutting surface of the stop member and the flat abutting surface of the latch portion is such that the removable panel will be held against the frame using a predetermined force.

Moreover, in a further exemplary aspect of the invention, at least one of the U-shaped members may have a further catch portion disposed on the surface of the second leg. The further catch portion is similar in configuration and orientation to the catch portion disposed on the latch retaining member. Further, at least one further stop member may be disposed at a junction between the respective U-shaped members, and the second handle. The further stop member projects upward and away from the surface, and has a flat abutting surface that extends approximately perpendicular to the surface, and is disposed to face in a direction toward a base of the U-shaped members. The flat abutting surface of the stop member is separated from the flat abutting surface of each of the further catch portions by the first predetermined distance, for example, the distance corresponding to a thickness of the removable panel. Thus, when the panel latch is installed in the removable panel, the flat abutting surface of the further stop member will abut against an outer surface of the removable panel, and the flat abutting surface of the further catch portion will abut against an inner surface of the removable panel, thus assisting to retain the panel latch on the removable panel. This advantageous configuration provides the panel latch with more support when it is disposed on the removable panel, and assists to prevent its removal from the removable panel.

Additionally, in a further exemplary aspect of the invention, the legs of one U-shaped member can be provided with a different thickness than the legs of the other U-shaped members. By providing the legs with a different thickness, it can be advantageously ensured that the panel latch will be inserted in the removable panel in a predefined orientation.

According to yet another exemplary aspect of the invention, an electromagnetic compatible compressible gasket may be disposed between the frame and the inner surface of the removable panel. The gasket helps reduce electromagnetic radiation from being emitted between the contacting edges of the system frame and the removable panel. Moreover, when the gasket is compressed between the latched frame and the removable panel, it will exert a force against the removable panel and the frame, thus advantageously reducing vibration of the removable panel relative to the frame.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, in the application, and if used, the terms "upper", "lower", "front", "back", "over", "under", and similar such terms are not to be construed as limiting the invention to a particular orientation. Instead, these terms are used only on a relative basis.

Figure 1:
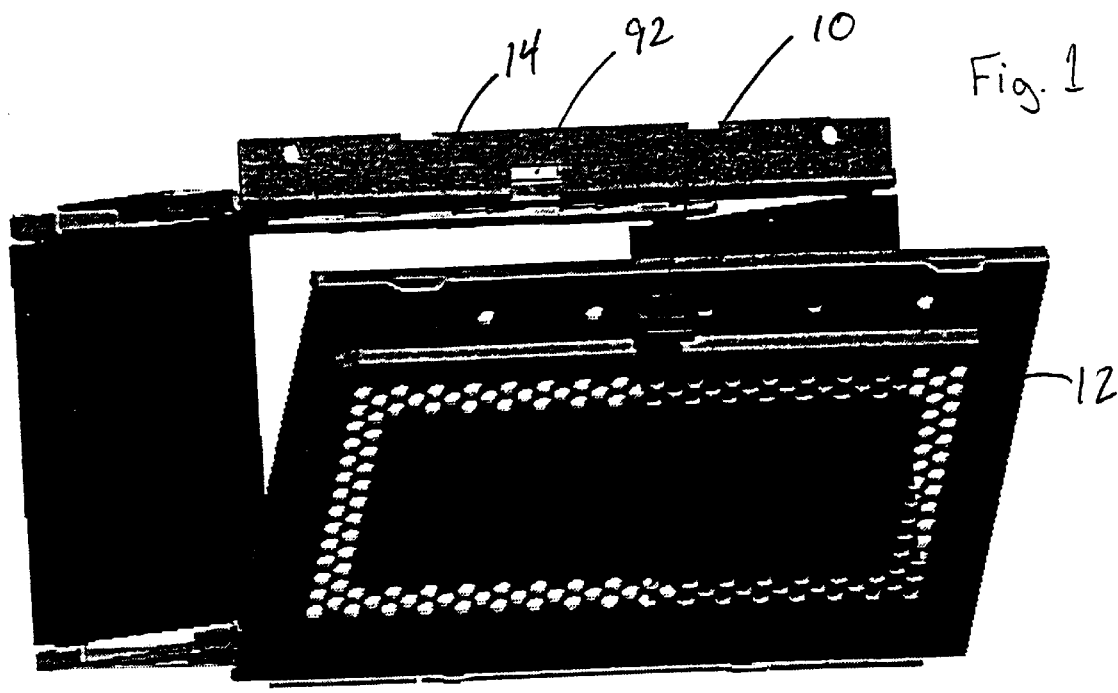
FIG. 1 is a perspective view of an exemplary embodiment of the present invention, being utilized with a panel and an underlying frame, with the panel being shown in an opened position.
Figure 2:
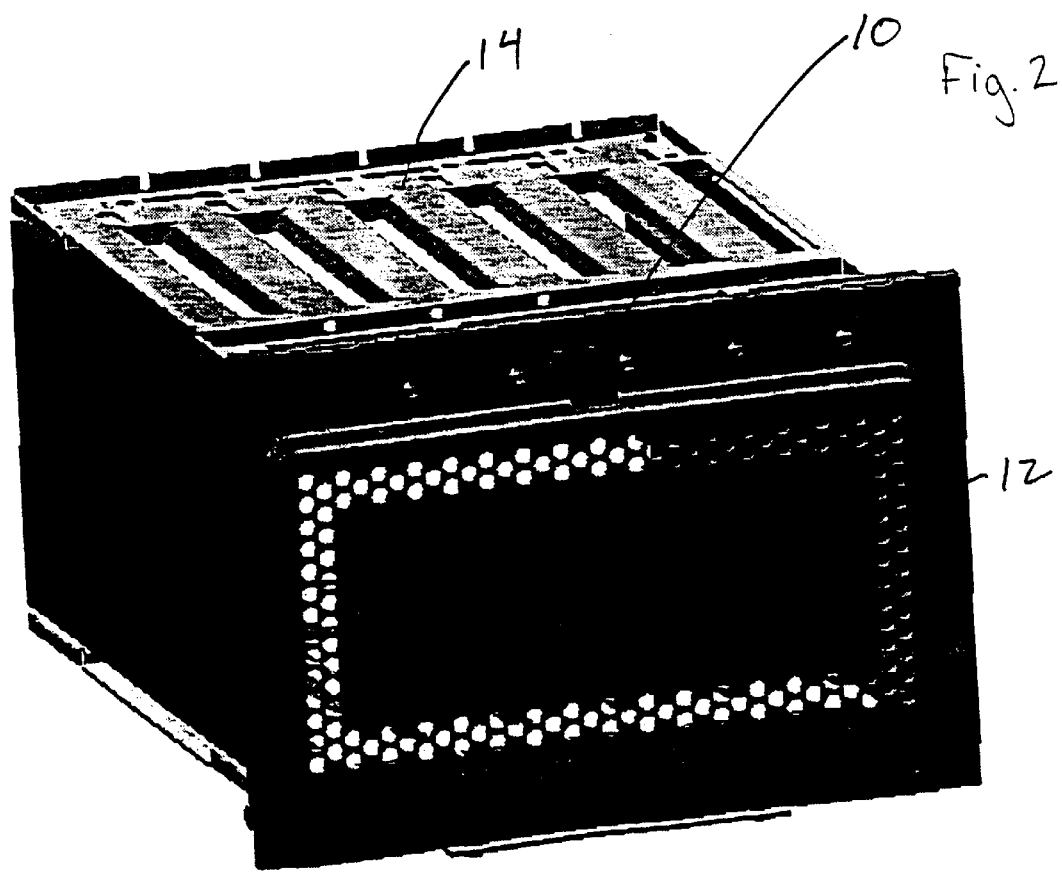
FIG. 2 is a perspective view of the present invention shown in FIG. 1, being utilized to latch the panel to the underlying frame.

Referring to FIGS. 1 and 2, an exemplary embodiment of a panel latch 10 according to the present invention is shown. The panel latch 10 is preferably formed from a non-conductive, rigid material, such as a polycarbonate material. However, the panel latch 10 can be formed from any material that has sufficient rigidity and strength to secure a panel in a desired position.

As shown, the panel latch 10 is illustrated in use with an enclosure. In particular, the panel latch 10 is shown as holding a first part, such as removable panel 12, to a receiving part, such as system frame 14. In the exemplary embodiment, the system frame 14 contains a DASD (direct access storage device, not shown), and the removable panel 12 is an EMC (electromagnetic compatible) shield panel, which is used to reduce electromagnetic radiation emissions generated from within the system frame 14. However, although the panel latch 10 according to the present invention can be advantageously used to minimize electromagnetic radiation emissions, the present invention is not limited for use with a system frame, or for use with an EMC shield panel. To the contrary, the panel latch 10 according to the present invention can be used in a variety of different latching situations, without departing from the spirit and scope of the present invention.

Figure 3:
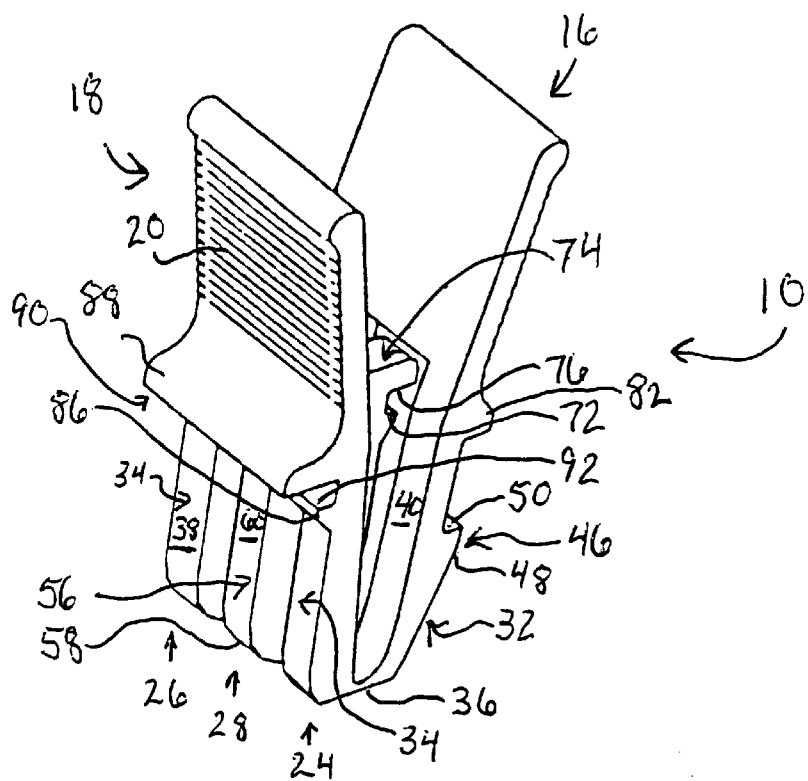
FIG. 3 is a back perspective view of the exemplary embodiment of the panel latch according to the present invention.
Figure 4:
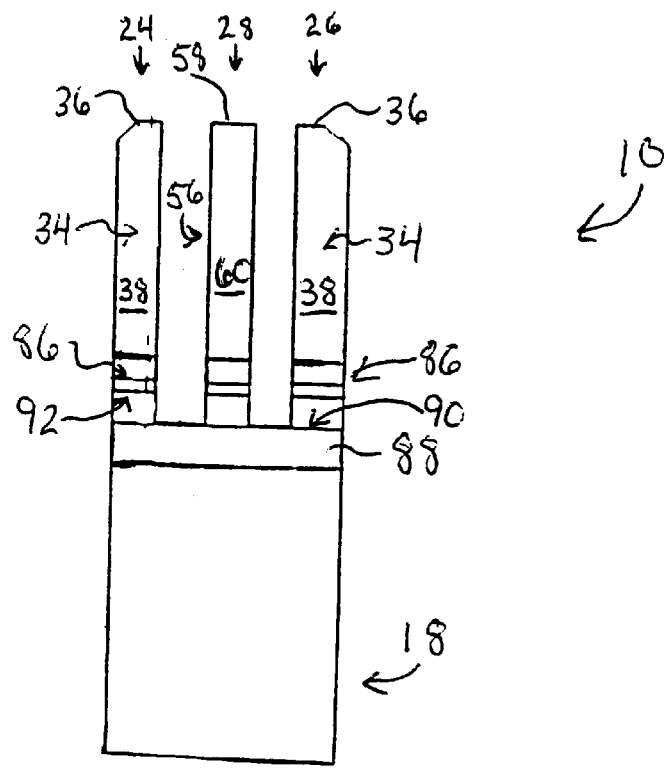
FIG. 4 is a back elevational view of the exemplary embodiment of the panel latch according to the present invention.
Figure 5:
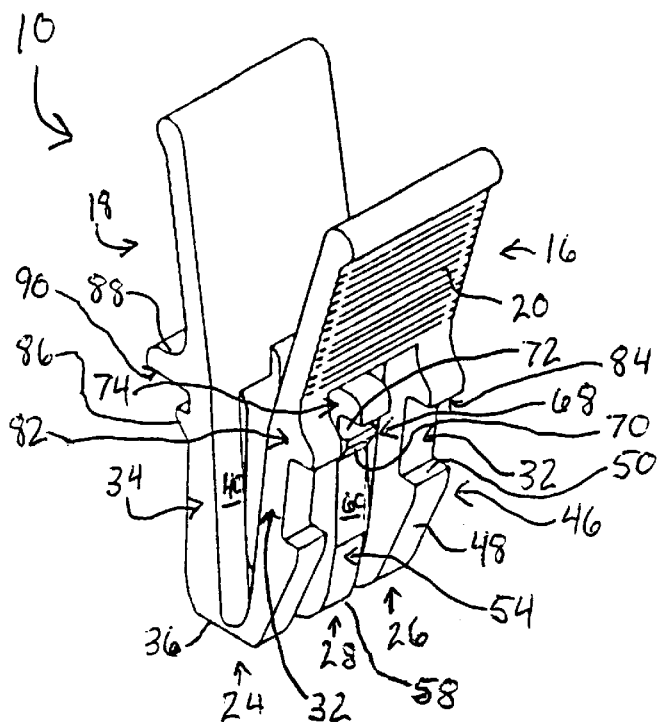
FIG. 5 is a front perspective view of the exemplary embodiment of the panel latch according to the present invention.
Figure 6:
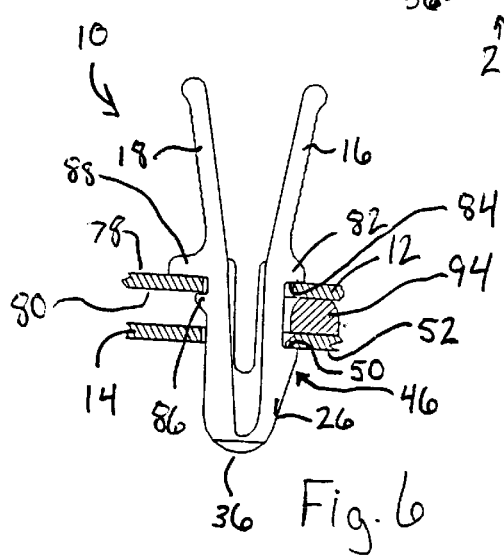
FIG. 6 is a side view of the exemplary embodiment of the panel latch, being used to latch a panel to an underlying member, with the panel and the underlying member being partially shown and in section.

As best shown in FIGS. 3–5, the panel latch 10 includes a first latch handle 16, and a second latch handle 18 arranged under the first latch handle 16. In a latched positioned (i.e., a position in which the panel latch 10 engages with the system frame 14 and the removable panel 12, as shown in FIGS. 2 and 6), the first latch handle 16 and the second latch handle 18 are spaced apart from each other. Further, the first latch handle 16 and the second latch handle 18 are positioned relative to each other so that the first latch handle 16 and the second latch handle 18 can be simultaneously gripped by a user, and positioned in contact with each other in response to opposing forces acting on the respective handles.

The latch handles 16, 18 may have a rectangular configuration, with each handle having a major outer surface 20. Further, the outer surface 20 may be a textured surface, to allow the user to securely grip the respective handles. Thus, the latch handles 16, 18 advantageously allow for an easy grasping of the panel latch 10, facilitating the insertion and release of the panel latch.

The first and second latch handles 16, 18 are joined together using a plurality of spaced apart and aligned U-shaped members 24, 26, 28. In the exemplary illustrated embodiment, there are three U-shaped members, with two of the U-shaped members 24, 26 being connected to both the first and second latch handles 16, 18, and with the third U-shaped member 28 being connected to only one of the latch handles, for example, the second latch handle 18. However, it is also contemplated that a different number of U-shaped members can be utilized in the panel latch, without departing from the spirit and scope of the present invention.

The U-shaped members 24, 26, 28 are used to hold the removable panel 12 to the system frame 14, and/or to hold the panel latch 10 to the removable panel 12. By providing a plurality of spaced apart U-shaped members 24, 26, 28 to perform these tasks, rather than one single larger latch member, for example, the size of a latch-accommodating opening in the removable panel 12 can advantageously be reduced. For example, and referring also to FIG. 7, in the case where there are three U-shaped members 24, 26, 28, instead of one large opening for receiving the panel latch 10, the removable panel 12 can be provided with three, relatively small, separate openings 30, each for accommodating a respective U-shaped member. By reducing the size of the openings in the removable panel 12, electromagnetic radiation emissions through the latch-accommodating openings 30 are advantageously reduced to a level that is lower than if one larger hole were provided, without significantly reducing the latching strength of the panel latch.

Furthermore, although the U-shaped members 24, 26, 28 are described as having a U-shape, this refers only to a general configuration of the members, and is not intended to limit the members to a specific shape. To the contrary, the U-shaped members may also be interchangeably referred to as V-shaped members, since the legs of one or more of the members may extend outward and away from each other, in the manner of a V.

Moreover, in the illustrated exemplary embodiment, the U-shaped members 24, 26, 28 are integrally formed with the latch handles 16, 18 and extend in a permanent relationship from an edge of a respective rectangular-shaped latch handle. This arrangement results in a one-piece configuration that advantageously reduces the number of components that need to be manufactured, and reduces the risk of losing a component of the panel latch 10. Moreover, since the panel latch 10 is self-contained, alignment of various latch components is unnecessary. However, other arrangements and connections between the U-shaped members and the latch handles are also within the scope of the present invention.

In the exemplary illustrated embodiment, two of the U-shaped members are substantially identically configured as flexible latch members 24, 26, which are used to latch the removable panel 12 to the underlying frame 14, for example. The flexible latch members 24, 26 are arranged essentially parallel to each other, and separated from each other by a space.

The U-shape of each flexible latch member 24, 26 is defined by first and second spaced-apart legs 32, 34 that are joined together at a base 36, which forms a bottom of the U-shape. Each leg 32, 34 has an end opposite to the base 36, that is permanently affixed to a respective latch handle 16, 18. In the exemplary illustrated embodiment, the first leg 32 is attached to an edge of the first latch handle 16, and the second leg 34 is attached to an edge of the second latch handle 18.

The legs 32, 34 can be joined to the base 36 to extend outward and away from each other when the panel latch 10 is in a non-latched position. Alternatively, the legs 32, 34 can be configured to be essentially parallel to each other.

As shown, each of the legs 32, 34 has a rectangular-shaped cross-sectional profile, so that each leg has four, essentially planar surfaces. A first one of the surfaces 38 faces outward and away from a space that separates the legs 32, 34 of a respective flexible latch member 24, 26, and a second one of the surfaces faces 40 inward, and toward the space that separates the legs 32, 34. The other two surfaces are essentially parallel to each other, and perpendicular to the first and second surfaces 38, 40. Although it is believed that this configuration is most suitable for the legs, the legs can have other cross-sectional profile shapes without departing from the spirit of the invention.

Each flexible latch member 24, 26 has a latch portion 46 positioned on the first, outer surface 38 of the first leg 32, and in a region toward the base 36 of the flexible latch member. The latch portion 46 has a surface 48 that slopes upward and away from the base 36 of the flexible latch member 24, 26, similar to a ramp, and a flat abutting surface 50 that extends approximately perpendicular to the first, outer surface 38 of the first leg 32. The flat abutting surface 50 and the sloping surface 48 are contiguous to each other, so as to form a step. When the panel latch 10 is installed and in the latched position, as shown in FIG. 6, the flat abutting surface 50 will abut against an inner surface 52 of the frame 14. This arrangement will advantageously allow a removable panel to be latched to a frame using no tools, as will be described in subsequent paragraphs. Moreover, since the latch portion 46 is disposed in a region of the base 36 of the flexible latch member 24, 26, when the panel latch 10 is latched to frame 14, only a minimal portion of the panel latch will protrude into the interior of the frame. Thus, the panel latch 10 advantageously does not occupy any substantial amount of space in the frame 14, allowing the interior of the frame to be utilized in a most efficient manner.

In the exemplary illustrated embodiment, the panel latch 10 has a third U-shaped member configured as a relatively rigid latch retaining member 28, which is used to semi-permanently engage the panel latch 10 to the removable panel 12, for example.

The latch retaining member 28 is arranged parallel to, and disposed between, the flexible latch members 24, 26. Further, the latch retaining member 28 is separated from each of the adjacent flexible latch members 24, 26 by a space.

The latch retaining member 28 has a configuration similar to the flexible latch members 24, 26. For example, the U-shape of the latch retaining member 28 is defined by first and second spaced-apart legs 54, 56 that are joined together at a base 58, which forms a bottom of the U-shape. However, and in contrast to the configuration of the flexible latch members 24, 26, only the second leg 56 of the latch retaining member 28 is permanently affixed to a latch handle, for example, the second latch handle 18, for example, by attaching the second leg 56 to a respective edge of the second latch handle 18. The first leg 54 of the latch retaining member 28 has a free end positioned adjacent to, but separated from, the edge of the first latch handle 16, as best shown in FIG. 5.

In order to increase the rigidity of the latch retaining member 28, the area between the legs 54, 56 in a region of the base 58 can be solidly configured, so that each leg has a reduced moment arm. Moreover, the legs 54, 56 can be configured with a greater thickness than the legs 32, 34 of the flexible latch members, thus reducing their flexibility.

Similar to the configuration of the legs 32, 34 of the flexible latch members, the legs 54, 56 of the latch retaining member 28 may have a rectangular-shaped cross-sectional profile, so that each leg has four, essentially planar surfaces. One of the surfaces 60 faces outward and away from the space that separates the legs 54, 56 of the latch retaining member 28, and a second one of the surfaces (not shown) faces inward, and toward the space that separates the legs. The other two surfaces are essentially perpendicular to the first two surfaces. Although it is believed that this configuration is most suitable for the legs, the legs can have other cross-sectional profile shapes without departing from the spirit of the invention.

The latch retaining member 28 has a catch portion 68 positioned on the first, outer surface 60 of the first leg 54. The catch portion 68 is positioned more proximate to the first latch handle 16 than the respective latch portions 46 disposed on the flexible latch members 24, 26.

The catch portion 68 has a surface 70 that slopes upward and away from the base 58, and a flat abutting surface 72 that extends approximately perpendicular to the first, outer surface 60 of the first leg 54. The flat abutting surface 72 and the sloping surface 70 are contiguous to each other, so as to form a step.

The latch retaining member 28 further has a stop member 74 positioned on the first, outer surface 60 of the first leg 54, and at the free end thereof. The stop member 74 projects upward and away from the first surface 60, and has a flat abutting surface 76 (FIG. 3) that extends approximately perpendicular to the first, outer surface 60. The flat abutting surface 76 of the stop member 74 faces the flat abutting surface 72 of the catch portion 68. Moreover, the flat abutting surface 76 of the stop member 74 is separated from the flat abutting surface 72 of the catch portion 68 by a predetermined distance, for example, a distance corresponding to a thickness of the removable panel 12. Thus, when the panel latch 10 is installed in the removable panel 12, the flat abutting surface 76 of the stop member 74 will abut against an outer surface 78 of the removable panel 12, and the flat abutting surface 72 of the catch portion 68 will abut against an inner surface 80 of the removable panel, thus retaining the panel latch 10 on the removable panel. This configuration will advantageously allow the panel latch 10 to be semi-permanently fastened to the removable panel 12, thus minimizing the chance of loss or damage to the panel latch.

In the exemplary illustrated embodiment, the flexible latch members 24, 26 are likewise provided with stop members 82 positioned on the first, outer surface 38 of the respective first legs 32, and in alignment with (i.e., essentially planar to) the stop member 74 disposed at the free end of the latch retaining member 28. Each stop member 82 projects upward and away from the respective first, outer surface 38, and has a flat abutting surface 84 that extends approximately perpendicular to the respective first, outer surface. The flat abutting surfaces 84 of the respective stop members 82 face the flat abutting surfaces 50 of the respective latch portions 46. Moreover, the flat abutting surfaces 84 of the respective stop members 82 are separated from the flat abutting surfaces 50 of the respective latch portions 46 by a predetermined distance, for example, a distance sufficient to accommodate the thickness of both the removable panel and the frame.

As shown best in FIG. 6, when the panel latch 10 is installed and in the latched position, the flat abutting surfaces 84 of the respective stop members 82 will abut against the outer surface 78 of the removable panel 12, and the flat abutting surfaces 50 of the respective latch portions 46 will abut against the inner surface 52 of the system frame 14. As such, both the removable panel 12 and the frame 14 will be held together. Moreover, the predetermined distance between the flat abutting surface 84 of the stop member 82 and the flat abutting surface 50 of the latch portion 46 is such that the removable panel 12 will be held against the frame 14 using a predetermined force.

Moreover, at least one of the U-shaped members 24, 26, 28 may have a further catch portion 86 disposed on the first, outer surface 38, 60 of the second leg 34, 56. The further catch portion 86 is similar in configuration and orientation to the catch portion 68 disposed on latch retaining member 28. In the exemplary illustrated embodiment, each of the U-shaped members 24, 26, 28 have a further catch portion 86 arranged in alignment with each other, and disposed at similar distances from the second latch handle 18. Alternatively, only the latch retaining member 28, or only the flexible latch members 24, 26 may be provided with a further catch portion. Other arrangements of the further catch portion are within the scope of the invention.

Further, at least one further stop member 88 is disposed at a junction between the respective U-shaped members 24, 26, 28, and the second latch handle 18. In the exemplary illustrated embodiment, only one further stop member 88 is provided, which extends a width of the latch handle 18, and which defines an end point of the respective second legs 34, 56. However, other arrangements and configurations of the further stop member are within the scope of the present invention.

The further stop member 88 projects upward and away from the first, outer surfaces 38, 60, has a flat abutting surface 90 that extends approximately perpendicular to the first surfaces, and is disposed to face in a direction toward a base 36, 58 of the U-shaped members 24, 26, 28. In the exemplary embodiment, the flat abutting surface 90 of the further stop member 88 is separated from a flat abutting surface 92 of each of the further catch portions 86 by a predetermined distance, for example, a distance corresponding to a thickness of the removable panel 12. Thus, when the panel latch 10 is installed in the removable panel 12, the flat abutting surface 90 of the further stop member 88 will abut against an outer surface 78 of the removable panel, and the flat abutting surface 92 of the further catch portion 86 will abut against an inner surface 80 of the removable panel, thus assisting to retain the panel latch 10 on the removable panel. This advantageous configuration provides the panel latch with more support when it is disposed on the removable panel, and assists to prevent its removal from the removable panel.

Further, in an exemplary embodiment, the legs 32, 34, 54, 56 of each U-shaped member 24, 26, 28 have a thickness of about 2.5 to about 3 millimeters. The legs of one U-shaped member can be provided with the same thickness as the legs of the other U-shaped members, or with a different thickness. In the exemplary embodiment, and as best shown in FIG. 4, the legs 54, 56 of the rigid latch retaining member 28 and the legs 32, 34 of one of the flexible latch members 24, have a thickness of about 2.5 millimeters, and the legs 32, 34 of the other flexible latch member 26 have a thickness of about 3 millimeters. By providing the legs with a different thickness, it can be advantageously ensured that the panel latch will be inserted in the removable panel in a predefined orientation, as will be subsequently described.

Moreover, in the illustrated exemplary embodiment, the U-shaped members 24, 26, 28 are spaced apart from each other by a distance between about 2.25 and about 2.75 millimeters. The spacing between the U-shaped members can be varied, to help ensure the latch panel is inserted in the removable panel in the predefined orientation.

Figure 7:
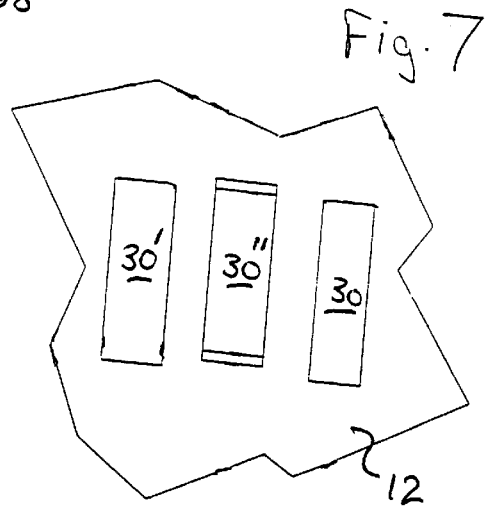
FIG. 7 is an elevational view of a section of the panel shown in FIG. 6, illustrating the arrangement of the openings used to accommodate the panel latch according to the present invention.

To use the panel latch 10 in one of its advantageous applications, the removable panel 12 is provided with a number of small holes 30, 30', 30", for example three, as shown in FIG. 7. Each hole 30, 30', 30" is sized and spaced to accommodate a respective U-shaped member 24, 26, 28 of the panel latch 10. In the illustrated exemplary embodiment, each hole 30, 30', 30" has a rectangular configuration having a height of about, for example, 8.2 to 9.2 millimeters, and a width of about, for example, 2.6 to 3.1 millimeters, i.e., a width that is slightly greater than a width of a corresponding U-shaped member. In the exemplary illustrated embodiment, a hole 30 for accommodating the more narrow flexible latch member 24 has a width of about 2.6 millimeters, and a hole 30' for accommodating the wider flexible latch member 26 has a width of about 3.1 millimeters. Since the wider flexible latch member 26 will not fit into the narrower hole, the panel latch 10 can only be inserted into the removable panel 12 in a predefined configuration.

Further, preferably each hole 30, 30', 30" has a height that is equal to or less than a distance between the opposing outer surfaces 38, 60 of the respective U-shaped members 24, 26, 28, as measured in a region of the respective stop members 74, 82, 88. For example, in the exemplary embodiment, the holes 30, 30', 30" have a height ranging between about 8.2 and about 9.2 millimeters.

According to the exemplary embodiment of the present invention, the panel latch 10 is permanently inserted into the removable panel 12. In order to insert the panel latch 10 into the removable panel 12, the user orientates the respective U-shaped members 24, 26, 28 in registration with the appropriate holes 30, 30', 30" formed in the removable panel 12. By urging the panel latch 10 in a direction toward the removable panel 12, the U-shaped members 24, 26, 28 will be inserted into the respective holes. The insertion of the panel latch 10 will undergo a minimal amount of resistance, until the upper and lower edges of the two outer holes 30, 30' come into contact with the sloping surfaces 48 of the respective latch portions 46. At this point, a continued urging of the panel latch 10 will cause the upper and lower edges of the outer holes to slide up the sloping surfaces 48, thus pushing the legs 32, 34 of the respective flexible latch members 24, 26 toward each other. This action continues until the upper edges of the outer holes 30, 30' pass the respective steps formed by the abutting surfaces 50 and the sloping surfaces 48 of the respective latch portions 46. At this point, the elasticity of the legs 32, 34 causes the legs to snap, i.e., spring back away from each other. Continued pushing of the panel latch 10 will subsequently cause the latch retaining member 28 to undergo the same action. The upper edges of the center hole 30" will come in contact with the sloping surface 70 of the catch portion 68, and the lower edges of all three holes will come into contact with the sloping surfaces of the further catch portions 86. This action continues until the edges of the respective holes pass the respective steps formed by the abutting surfaces 72, 92 of the respective catch portions 68, 86. At this point, the elasticity of the legs 32, 34, 54, 56 causes the legs to snap back away from each other, thus trapping the removable panel 12 between the respective catch portions 68, 86 and the respective stop members 74, 88. As shown in FIG. 6, in this position, the latch handles 16, 18 of the panel latch 10 will project from one side of the removable panel 12, and a major portion of the respective U-shaped members 24, 26, 28, including the respective latch portions 46, will project from the opposite side of the removable panel 12. Further, because the latch retaining member 28 is relatively rigid, and since the sloping surfaces of the catch portions 68, 86 will only function to move the legs 32, 34, 54, 56 toward each other when the panel latch 10 is inserted, the panel latch 10 is effectively permanently inserted in the removable panel 12.

Further, as shown in FIG. 1, the frame 14 is provided with at least one hole 92 that is sized to accommodate the base ends of the U-shaped members 24, 26, 28 when the removable panel 12 is latched in place. The hole 92 in the frame 14 is located so that the three holes 30, 30', 30" in the removable panel 12 are superposed over the hole in the frame, when the removable panel is properly positioned against the frame. Moreover, the hole 92 has a width that can easily accommodate the panel latch 10, and a height that is equal to or less than a distance between the opposing outer surfaces 38 of the respective flexible latch members 24, 26, as measured in a region of the abutting surfaces 50 of the respective latch portions 46.

In order to latch the removable panel 12 to the underlying frame 14, the removable panel (with the panel latch 10 inserted therein) is simply positioned adjacent to the frame. The portion of the panel latch 10 protruding from the inner surface 80 of the removable panel 12, i.e., the U-shaped members 24, 26, 28, is inserted into the opening 92 formed in the frame 14. As the U-shaped members 24, 26, 28 are inserted further into the opening 92, the upper edges of the opening 92 will slide up the sloping surfaces 48 of the respective latch portions 46, thus pushing the legs 32 of the respective flexible latch members 24, 26 toward the legs 34. This action continues until the edge of the hole 92 passes the respective steps formed by the abutting surfaces 50 and the sloping surfaces 48 of the respective latch portions 46. At this point, the elasticity of the legs 32, 34 causes the legs to snap back away from each other, thus holding the frame 14 between the respective latch portions 46 and the inner surface 80 of the removable panel 12, with only a minimal portion of the panel latch 10 protruding into the system frame 14.

In order to release the removable panel, a user grips the two latch handles 16, 18, and squeezes the handles toward each other. As the latch handles 16, 18 are brought toward each other, the ends of the legs 32, 34 of the flexible latch members 24, 26 are likewise brought toward each, causing the latch portions 46 on the first legs 32 to be shifted in a direction toward the second legs 34. This will cause the latch portions 46 to move out of engagement with the frame 14, thus allowing the removable panel 12 and panel latch 10 to be separated from the frame. However, since the rigid latch retaining member 28 is only directly connected to one of the handles 18, the squeezing of the latch handles 16, 18 has no effect on the connection between the panel latch 10 and the removable panel 12. As such, the panel latch 10 remains securely affixed to the removable panel 12 at all times.

According to an exemplary embodiment, and as shown in FIG. 6, an electromagnetic compatible compressible gasket 94 may be disposed between the frame 14 and the inner surface 80 of the removable panel 12. The gasket 94 helps reduce electromagnetic radiation from being emitted between the contacting edges of the frame and the removable panel. Moreover, when the gasket 94 is compressed between the latched frame 14 and the removable panel 12, it will exert a force against the removable panel 12 and the system frame 14, thus advantageously reducing vibration of the removable panel relative to the frame.

Although the above exemplary embodiments have described the invention in use with a system frame and a removable panel, the panel latch can be utilized whenever a removable part needs to latched to a receiving part.

Moreover, the dimensions given above for the components of the panel latch, and for the openings in the system frame and removable panel, can be modified in accordance with specific requirements, without departing from the spirit of the invention. Moreover, the relativeness of the dimensions can likewise be changed without departing from the spirit of the invention.

It should thus be understood that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes, and adaptations, and the same are intended to be comprehended within the meaning and range of equivalents of the appended claims.

What is claimed is:

1. A panel latch, comprising:
    at least a first and a second generally U-shaped, flexible latch member, said first and second flexible latch members being arranged parallel to each other, and separated from each other by a space, each said flexible latch member having a base portion, a first leg, and a second leg attached to the first leg via the base portion, each said flexible latch member further having a latch portion and a stop member disposed on the first leg, said latch portion being separated from the stop member to accommodate therebetween at least two separate parts that are to be latched together;
    a first handle attached to the respective first legs; and
    a second handle attached to the respective second legs, the second handle and the first handle being movable toward each other, thereby causing the flexible latch members to flex so that the respective latch portions and the respective stop members are shifted in a direction toward the respective second legs to allow the two parts to be unlatched from each other.

2. A panel latch, comprising:
    at least one generally U-shaped, flexible latch member having a base portion, a first leg, and a second leg attached to the first leg via the base portion, said flexible latch member further having a latch portion and a stop member disposed on the first leg, said latch portion being separated from the stop member to accommodate therebetween at least two separate parts that are to be latched together;
    a first handle attached to the first leg; and
    a second handle attached to the second leg, the second handle and the first handle being movable toward each other, thereby causing the flexible latch member to flex so that the latch portion and the stop member are shifted in a direction toward the second leg to allow the two parts to be unlatched from each other,
    wherein said latch portion is disposed on the first leg in a region toward the base portion, and said stop member is disposed on the first leg in a region toward the first handle, and
    wherein said at least one flexible latch member comprises a first and a second flexible latch member arranged parallel to each other, and separated from each other by a space.

3. The panel latch defined in claim 2, further comprising a generally U-shaped, rigid latch retaining member having a base portion, a first leg, and a second leg attached to the first leg of the latch retaining member via the base portion of the latch retaining member, said first leg of said latch retaining member having a free end disposed adjacent to said first handle, and separated from said first handle by a space, said second leg of said latch retaining member having a second end attached to said second handle, wherein said first leg of said latch retaining member has a catch member and a stop member disposed thereon in a region of the free end to accommodate and retain therebetween only one of the at least two separate parts that are to be latched together, and wherein when the first handle and the second handle are moved toward each other, a shape of the latch retaining member remains unchanged, so that the only one of the at least two separate parts remains retained to the latch retaining member when the two separate parts are unlatched from each other.

4. The panel latch defined in claim 3, wherein said latch retaining member is essentially parallel to, adjacent to, separated from, and positioned between said first and second flexible latch members.

5. The panel latch defined in claim 4, wherein said stop members disposed on the respective flexible latch members each have an abutting surface that faces a respective latch portion, and said stop member disposed on the latch retaining member has an abutting surface that faces the catch member, all of said abutting surfaces being disposed in essentially a same plane.

6. The panel latch defined in claim 5, wherein each of said latch portions has a sloping surface that extends upward from a respective base portion, and an abutting surface that is contiguous with the respective sloping surface to form a step, the abutting surface of each respective latch portion facing a respective abutting surface of a respective stop member, and being separated thereby by a first distance sufficient to accommodate therebetween the at least two separate parts.

7. The panel latch defined in claim 6, wherein said catch member has a sloping surface that extends upward and away from the base portion of said latch retaining member, and an abutting surface that is contiguous with the sloping surface of the catch member to form a step, the abutting surface of the catch member facing the abutting surface of the stop member on the latch retaining member, and being separated thereby by a second distance that is less than the first distance, the second distance being sufficient to accommodate therebetween the one of the at least two separate parts.

8. The panel latch defined in claim 7, further comprising at least one further stop member disposed in a region of said second handle, and at least one further catch member disposed on a respective second leg, said further stop member and said further catch member accommodating and holding therebetween the only one of the two separate parts that are to be latched together.

9. The panel latch defined in claim 8, wherein each of the second legs has a respective further catch member disposed thereon, and wherein said further stop member extends a width of the second handle and is positioned at a junction between each of the second legs and the second handle.

10. A panel latch, comprising:
at least one generally U-shaped, flexible latch member having a base portion, a first leg, and a second leg attached to the first leg via the base portion, said flexible latch member further having a latch portion and a stop member disposed on the first leg, said latch portion being separated from the stop member to accommodate therebetween at least two separate parts that are to be latched together;
a first handle attached to the first leg;
a second handle attached to the second leg, the second handle and the first handle being movable toward each other, thereby causing the flexible latch member to flex so that the latch portion and the stop member are shifted in a direction toward the second leg to allow the two parts to be unlatched from each other; and
a generally U-shaped, rigid latch retaining member having a base portion, a first leg, and a second leg attached to the first leg of the latch retaining member via the base portion of the latch retaining member, said first leg of said latch retaining member having a free end disposed adjacent to said first handle, and separated from said first handle by a space, said second leg of said latch retaining member having a second end attached to said second handle, wherein said first leg of said latch retaining member has a catch member and a stop member disposed thereon in a region of the free end to accommodate and retain therebetween only one of the at least two separate parts that are to be latched together, and wherein when the first handle and the second handle are moved toward each other, a shape of the latch retaining member remains essentially unchanged.

11. The panel latch defined in claim 10, wherein said latch portion and said catch member each has a sloping surface that extends upward from the respective corresponding base portions, and each having an abutting surface that is contiguous with the respective sloping surface to form a step, the abutting surface of the latch portion facing the stop member on the flexible latch member, and being separated thereby by a first distance sufficient to accommodate therebetween the at least two separate parts, and the abutting surface of the catch member facing the stop member on the latch retaining member, and being separated thereby by a second distance that is less than the first distance, the second distance being sufficient to accommodate therebetween the only one of the at least two separate parts.

12. A panel latch, comprising:
at least one flexible latch member having a base portion, a first leg, and a second leg attached to the first leg via the base portion, said flexible latch member further having a latch portion and a stop member disposed on the first leg, said latch portion being separated from the stop member to accommodate therebetween at least two separate parts that are to be latched together, said first and second legs being flexible so as to allow the latch portion and the stop member to be shifted in a direction toward the second leg to allow the two parts to be latched to, and unlatched from, each other; and
a rigid latch retaining member having a base portion, a first leg, and a second leg attached to the first leg of the latch retaining member via the base portion of the latch retaining member, said first leg of said latch retaining member having a free end, said second leg of said latch retaining member having a second end connected to said flexible latch member, said first leg of said latch retaining member having a catch member and a stop member disposed thereon in a region of the free end to accommodate therebetween only one of the at least two separate parts that are to be latched together, said rigid latch retaining member being engaged with the only one of the at least two separate parts, when the at least two separate parts are latched to, and unlatched from, each other.

13. The panel latch defined in claim 12, wherein said latch retaining member is essentially parallel to, adjacent to, and separated from said flexible latch member.

14. The panel latch defined in claim 13, wherein said at least one flexible latch member comprises a first and a second flexible latch member arranged parallel to each other, and separated from each other by a space, said latch retaining member being disposed between said first and second flexible latch members.

15. The panel latch defined in claim 14, wherein said first flexible latch member, said second flexible latch member and said latch retaining member each has a generally U-shape configuration.

16. A computer, comprising:
a frame adapted to contain electrical components, said frame having an opening that provides access to the electrical components;
a removable shield panel positionable to cover the opening so as to attenuate electromagnetic radiation emissions from within the frame; and a panel latch that automatically latches the removable shield panel to the frame, including:
  a flexible latch member having a base portion, a first leg, and a second leg attached to the first leg via the base portion, said flexible latch member further having a latch portion and a stop member disposed on the first leg, said latch portion being separated from the stop member to accommodate therebetween the frame and the shield panel, said first and second legs being flexible so as to allow the latch portion and the stop member to be shifted in a direction toward the second leg to allow the frame and the shield panel to be latched to, and unlatched from, each other; and
  a rigid latch retaining member having a base portion, a first leg, and a second leg having an end attached to an end of the first leg of the latch retaining member via the base portion of the latch retaining member, said second leg of said latch retaining member having a further end connected to said flexible latch member, said first leg of said latch retaining member having a free end, and a catch member and a stop member disposed in a region of the free end to accommodate therebetween only the shield panel, said latch retaining member being engaged with the shield panel when the shield panel and the frame are latched to and unlatched from, each other.

17. The computer defined in claim 16, wherein said shield panel has a first opening that accommodates the flexible latch member, and a second opening separated from the first opening that accommodates the latch retaining member.

18. The computer defined in claim 17, wherein the flexible latch member is a first flexible latch member, and wherein the panel latch further comprises a second flexible latch member arranged parallel to and separated from the first flexible latch member, said latch retaining member being disposed between said first and second flexible latch members, and wherein said shield panel has a third opening that accommodates the second flexible latch member, the third opening being separated from the first and second openings.

19. The computer defined in claim 18, wherein said first flexible latch member, said second flexible latch member, and said latch retaining member each has a generally U-shape configuration.

20. The computer defined in claim 19, wherein the first and second legs of each of said first flexible latch member, said second flexible latch member, and said latch retaining member have a rectangular, cross-sectional profile.

21. The computer defined in claim 20, wherein the panel latch further includes a first handle attached to the first legs of each of the first and second flexible latch members, the free end of the first leg of the latch retaining member being disposed adjacent to, and separated from, the first handle, the panel latch additionally including a second handle attached to the second legs of each of the first and second flexible latch members and the latch retaining member, said first and second handle being movable toward each other to cause the latch portion and the stop member of the first and second flexible latch members to be shifted.

22. The computer defined in claim 21, wherein each of said handles has a rectangular profile, and a textured outer surface.

23. The computer defined in claim 22, wherein said panel latch has a one-piece configuration.

24. The computer defined in claim 19, wherein the frame includes a further opening for accommodating a base of said panel latch when the frame and the shield panel are latched together.

25. The computer defined in claim 24, further comprising a compressible electromagnetic compatible gasket disposed between the frame and the shield panel when the frame and the shield panel are latched together.

* * * * *